United States Patent [19]
Lingle et al.

[11] Patent Number: 5,837,108
[45] Date of Patent: Nov. 17, 1998

[54] MATCHABLE, HEAT TREATABLE, DURABLE, IR-REFLECTING SPUTTER-COATED GLASSES AND METHOD OF MAKING SAME

[75] Inventors: Philip J. Lingle, Temperance; Klaus W. Hartig, Brighton; Steven L. Larson, Monroe, all of Mich.

[73] Assignee: Guardian Industries Corp., Auburn Hills, Mich.

[21] Appl. No.: 908,180

[22] Filed: Aug. 7, 1997

Related U.S. Application Data

[60] Division of Ser. No. 572,061, Dec. 14, 1995, Pat. No. 5,688,585, which is a continuation-in-part of Ser. No. 486,643, Jun. 7, 1995, which is a continuation-in-part of Ser. No. 102,281, Aug. 5, 1993.

[51] Int. Cl.$^6$ .............................. C23C 14/00; C23C 14/23
[52] U.S. Cl. .................................. 204/192.15; 204/192.1; 204/192.26; 204/192.22; 204/192.25; 65/60.1; 65/60.2; 65/60.4; 65/60.8; 65/63; 427/162; 427/164; 427/165; 427/372.2; 427/376.2; 427/376.6; 427/380; 427/383.5; 427/397.7; 427/383.1; 427/419.7

[58] Field of Search .............................. 204/192.1, 192.15, 204/192.22, 192.25, 192.26; 65/60.1, 60.2, 60.4, 60.8, 63; 427/162, 164, 165, 372.2, 376.2, 376.6, 380, 383.5, 383.1, 397.7, 419.7

[56] References Cited

U.S. PATENT DOCUMENTS

| | | | |
|---|---|---|---|
| 4,450,201 | 5/1984 | Brill et al. | 428/698 |
| 5,085,926 | 2/1992 | Iida et al. | 428/472 |
| 5,411,794 | 5/1995 | Kawaguchi et al. | 428/428 |
| 5,543,229 | 8/1996 | Ohsaki et al. | 428/216 |

FOREIGN PATENT DOCUMENTS 0536607  4/1993  European Pat. Off. .

*Primary Examiner*—Archene Turner
*Attorney, Agent, or Firm*—Hall, Priddy & Myers

[57] ABSTRACT

A sputter-coated layer system including a non-nitrided and non-oxidized nickel or nickel alloy layer located between two layers of $Si_3N_4$ of the requisite thicknesses and used for architectural and automotive glass substrates so as to be heat treatable and have ΔE characteristics sufficiently low to render the products matchable as between heat treated and non-heat treated products having the same coating thereon.

10 Claims, 1 Drawing Sheet

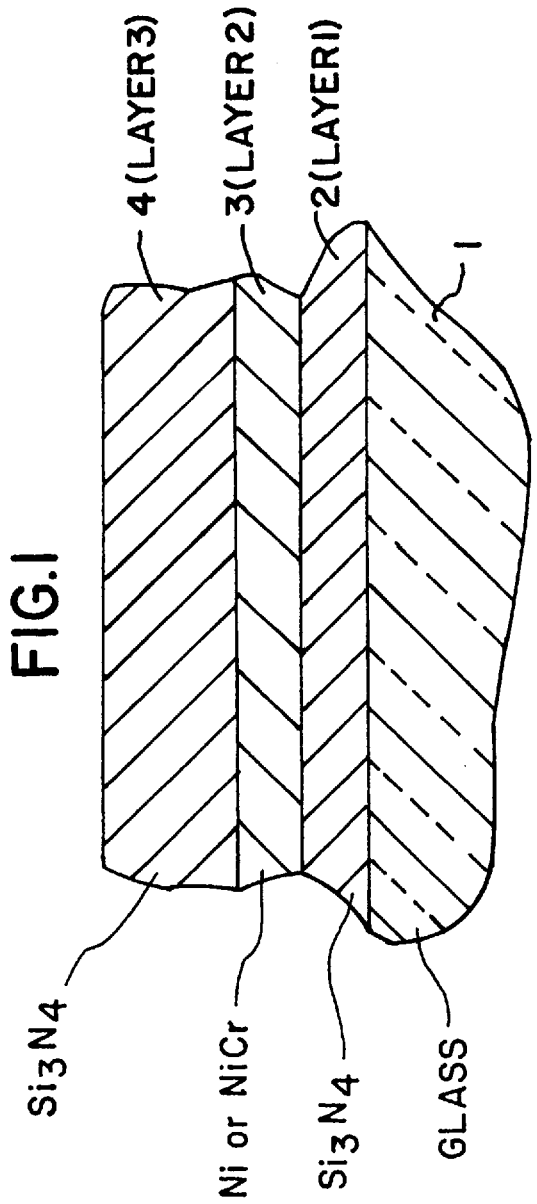

5,837,108

MATCHABLE, HEAT TREATABLE, DURABLE, IR-REFLECTING SPUTTER-COATED GLASSES AND METHOD OF MAKING SAME

This is a division of application Ser. No. 08/572,061 filed on Dec. 14, 1995, now U.S. Pat. No. 5,688,585 which is a C-I-P of appln. Ser. No. 08/486,643 filed on Jun. 7, 1995 which is a C-I-P of appln. Ser. No. 08/102,281 filed on Aug. 5, 1993.

FIELD OF INVENTION

This invention relates to sputter-coated glasses and methods of making them. More particularly, this invention relates to sputter-coated glasses which are heat treatable and durable and whose glass side appearance does not change significantly during heat treatment.

BACKGROUND OF THE INVENTION

The popularity of metal and metal oxide coated glasses in architectural and automotive design is well known. As reported prolifically in patent and other literature, such glasses usually achieve, through the manipulation of the coating's layering system, quite acceptable degrees of reflectance, transmittance, emissivity, chemical resistance, and durability, as well as the color desired. See, for example, in this respect, U.S. Pat. Nos. 3,935,351; 4,413,877; 4,462,883; 3,826,728; 3,681,042; 3,798,146; and 4,594,137 just to name a few.

It has also been well reported that while several reasonably acceptable techniques exist for applying such coatings, one of the most efficacious, and thus preferred, is the well known technique referred to as "magnetically enhanced sputter coating". Such a technique is reported in U.S. Pat. No. 4,166,018, a recognized fundamental teaching on the subject. (See also, Munz et al. "Performance and Sputtering Criteria of Modern. Architectural Glass Coatings", SPIE Vol. 325, *Optical Thin Films,* 1982, pp. 65–73.)

In recent years, the popularity of coated glasses has occasioned numerous attempts at achieving a coated glass article which, prior to heat treatment, can be coated, and which thereafter, can be heat treated without adversely changing the characteristics of the coating or the glass itself (i.e. the resulting glass article). One of the reasons for this is, for example, that it can be extremely difficult to achieve a uniform coating on an already bent piece of glass. It is well known that if a flat glass surface can be coated and thereafter bent, much simpler techniques can be used to get a uniform coating than if the glass has been previously bent. This is also true, in this respect, for example, in architectural and residential glass where in certain instances tempered and untempered glass sheets are used in the same building and must be matched as closely as possible in at least their glass side appearance as to color and reflectance, a characteristic best represented by $\Delta E$ as defined in ASTM Designation D-2244-93 (published November 1993) entitled "Standard Test Method for Calculation of Color Differences From Instrumentally Measured Color Coordinates". In short, the lower the $\Delta E$, the closer the match.

Certain techniques have been developed in the past for making coated heat treatable glass articles which may then, and thereafter, be heat treated by way of tempering, bending, or a technique known as "heat strengthening". Generally speaking, many of these prior coated articles, have suffered from not being heat treatable at the higher, n elevated temperatures necessary to achieve economic bending, tempering, and/or heat strengthening (i.e. 1150° F.–1450° F.). In short, such techniques have often suffered from a need to keep the temperature at approximately 1100° F. or less in order to achieve heat treatability without adversely affecting the coating or its substrate. In virtually all prior, known techniques a substrate coated with the system was not truly matchable with itself after undergoing heat treatment, even if deemed heat treatable, as reflected, for example, by too high a $\Delta E$ value in at least its glass side reflectance characteristic.

The absence of any substantial adverse affect upon the coating or its substrate, defines what is meant herein by the term "heat treatable". While in certain situations some characteristics may change somewhat during heat treatment, to be "heat treatable" as used herein means that the desired properties such as emissivity, sheet resistance, durability and chemical resistance of the ultimate layer system and overall product must be achieved despite the fact that the coated glass has been subjected to one or more of the heat treatments discussed above (i.e. bending, tempering and/or heat strengthening). For most architectural purposes contemplated by this invention optimized heat treatability means that the glass and its layered coating remains substantially unchanged in at least its emissivity, sheet resistance, durability and chemical resistance properties as between the pre-heat treated product and the final product after heat treatment. For most automotive, as well as architectural, purposes an emissivity change for the better (i.e. lowering) due to the heat treatment may be tolerated and is even desirable, so long as optimized heat treatability means that the change takes place uniformly across the substrate and is independent of the parameters used to perform the heat treatment.

In the embodiments of this invention, the coating system is preferably "heat treatable" within the meaning of this term as defined above, but equally as essential, the article so coated with the coating system after heat treatment is also matchable with a similar article which has not been heat treated (e.g. itself before heat treatment) because its $\Delta E$, at least as to glass side reflectance, has been minimized as a characteristic of the coating system (i.e. due to the uniqueness of certain of the coating systems of this invention).

In this respect, U.S. Pat. No. 5,188,887 discloses certain prior art coating systems which are heat treatable because they can be heat treated successfully at the higher, more elevated temperatures aforesaid, to achieve the desired result despite having gone through tempering, bending or heat strengthening. Generally speaking, these prior art coating compositions find their uniqueness in a layering system which employs as a metallic layer, a high nickel content alloy which, in its preferred form, is an alloy known as Haynes 214, consisting essentially of 75.45% Ni, 4.00% Fe, 16.00% Cr, 0.04% C, 4.50% Al, and 0.01% Y (percentages are by weight). By using a high nickel content alloy, such as Haynes 214, and overcoating it with stoichiometric tin oxide ($SnO_2$) either alone or with other layers (such as an undercoat of the same stoichiometric tin oxide and/or an intermediate layer of aluminum between the top $SnO_2$ layer and the high content nickel alloy), it was found that heat treatability of glass articles at elevated temperatures of from approximately 1150° F.–1450° F. from about 2–30 minutes, could be achieved without substantial degradation of color, mechanical durability, emissivity, reflectance or transmittance. These compositions therefore constituted a significant improvement over prior heat treatable systems such as those disclosed in the following U.S. Pat. Nos.: 4,790,922; 4,816,034; 4,826,525; 4,715,879; and 4,857,094. However, such coating systems were found to be unmatchable as defined above and as exemplified by their rather high ΔE's resulting from heat treatment.

In addition to the above disclosures in the aforesaid patents, the Leybold windshield glass system TCC-2000 is also known. In this system, four or five layers of metals and metal oxides are employed to obtain a sputter-coated glass which, being somewhat heat treatable at temperatures up to 1100° F. may be used as a pre-coated glass for making bent or unbent glass windshields, provided that rapid time limits are placed on the heat treatment. The layering from glass substrate outwardly usually includes a first layer of tin oxide, a second layer of nickel/chrome alloy (usually about 80/20), a third layer of silver, a fourth layer of the nickel/chrome alloy, and a fifth layer of tin oxide. In addition to the rather low upper limit on heat treatment temperature and times, the resultant-coatings are rather soft and exhibit such unacceptably low chemical resistance characteristics that they can realistically be used only on the inner surfaces of laminated glass windshields. Matchability is unattainable in these systems.

In the aforesaid U.S. Pat. No. 4,715,879, it is specifically taught that the layering system therein cannot be achieved unless the protective layer of a metal oxide (e.g. tin oxide) be formed such that the oxide has an oxygen deficit (i.e. is non-stoichiometric). This, of course, requires delicate balancing in the manufacturing process. Heat treatability, in this respect, is also disclosed in U.S. Pat. No. 4,826,525. However, in this patent it is specifically taught that a layer of aluminum must be applied to achieve heat treatability. In neither instance, however, is matchability achievable.

In the aforesaid U.S. Pat. No. 5,229,194, a significant advance in heat treatable sputter coatings is disclosed, even when compared to those disclosed in U.S. Pat. No. 5,188,887. In that invention it was found that unique results in the area of heat treatable sputter-coated glasses were achievable, particularly when used as "privacy" windows in vehicles, if metallic nickel or a high content metallic nickel alloy layer were surrounded by an undercoat and overcoat of a separate layer of an oxide or nitride of nickel or high content nickel alloy, and a further overcoat of an oxide such as $SnO_2$, ZnO, $TiO_2$ or oxide alloys thereof was employed. Silicon is also mentioned as useful for the first overcoat of the metallic nickel-containing layer.

Such layering systems in their preferred forms proved particularly heat treatable and abrasion resistant. However, while some were found initially to be chemically resistant, certain systems when put into mass production were found not to pass the rather rigorous 5% HCl boil chemical resistance test (discussed below). Their infrared and UV reflectance characteristics were, however, found to be excellent for a wide range of uses. Still further, however, their visible light transmittance values, desirably low for "privacy" window use, nevertheless proved to be too low to be truly useful as glass windows or panels for architectural or residential purposes where high visible light transmittance is required. Thus when production called for the sputter-coater to fulfill orders for architectural or residential coated glass after glass sheets for "privacy" windows had been coated, the coater had to be shut down so that a new layer system could be formed. If such a shutdown could be avoided a significant economic advance would be accomplished. Matchability once again was found to be lacking.

In U.S. Pat. No. 5,344,718, there is disclosed certain unique sputter-coated layering system having unique applicability for architectural and residential purposes because of their achievement of not only good chemical and mechanical durability, but their solar management properties as well. These systems are properly deemed "low-E" glasses (coatings) because their hemispherical emissivity ($E_h$) was generally less than about 0.16 and their normal emissivity ($E_n$) was generally less than about 0.12. Measured another way, their sheet resistance was preferably less than about 10.5 ohms/square. In addition, for normal glass thicknesses (e.g. 2 mm–6 mm), visible light transmittance was preferably about 78% or more (compared to less than about 22–23% in certain preferred embodiments of the aforesaid heat treatable "privacy" window layer systems).

The invention in this aforesaid '718 patent achieved its unique low-E, high visible light transmittance values, along with its good chemical durability and resistance to abrasion, by employing a layer system which generally comprised (from glass outwardly) an undercoat layer of $Si_3N_4$, a first layer of nickel or nickel alloy, a layer of silver, a second layer of nickel or nickel alloy, and an overcoat layer of $Si_3N_4$. In certain preferred embodiments the layer system from glass outwardly consisted essentially of:

$Si_3N_4/Ni:Cr/Ag/Ni:Cr/Ag/Ni:Cr/Si_3N_4$

This seven layer system was found to exhibit somewhat higher durability and scratch resistance characteristics than the above-described five layer system. In each system, however, the preferred Ni:Cr layer was nichrome, i.e. 80/20 by weight Ni:Cr, and in which a substantial portion of the chromium formed as a nitride of Cr because the Ni:Cr layer was formed in a nitrogen-containing atmosphere.

Unfortunately, these durable, low-E, high visible transmittance glass layer systems proved to be non-heat treatable and are not matchable. This has now been found to be true not because of any oxidation of the silver layer(s), but because the metallic silver layer(s) during heat treatment become(s) discontinuous due to non-wetting; in this case, because the Ni:Cr surrounding layers are insufficient to maintain the continuity of the silver layer(s) during heat treatment. Thus these otherwise advantageous layer systems could not be used where the layered glass was thereafter to be heat treated as by tempering, heat strengthening and bending. Unfortunately, the silver layers were necessary to employ in order to achieve the desired low-E levels.

It is to be remembered, in this respect, that it is not just in the automotive windshield art where heat treatable sputter-coated layer systems find their utility. As stated above, certain architectural and residential uses also require the coated glass to be tempered, bent, or heat strengthened. Still further, the low-E glass systems of the aforesaid '718 patent could generally not be adjusted to achieve low enough visible transmittance values to make them useful in "privacy" windows", even if they were heat treatable . . . which they were not.

In U.S. Pat. No. 5,376,455 there are disclosed certain heat treatable, "Low-E" coating systems. These systems generally comprise, from the glass outwardly, a first layer of $Si_3N_4$ (approx. 350 Å–450 Å), a first layer of nickel or nichrome (approx. 20 Å), a layer of silver (approx. 50 Å–120 Å), a second layer of nickel or nichrome (approx. 7 Å) and a second layer of $Si_3N_4$ (approx. 450 Å–550 Å). While matchability between heat treated and unheated systems was achieved, it was only achieved by matching two different layer systems (e.g. col. 23, l. 68–col. 24, l. 21). Thus, while a significant step forward in the art, these systems generally could not provide a single layer system which, being "heat treatable", also possessed at least a sufficiently low enough glass side reflectance ΔE to be considered matchable after heat treatment with itself (e.g. the same coating system applied simultaneously to the same substrate batch, or later to another batch) before heat treatment.

As can be seen from the above, heretofore if the skilled artisan wished to continue to achieve the known benefits of abrasion and corrosion (i.e. chemical) resistance by using $Si_3N_4$ layers, but also wished to avoid costly downtime or the need to create a different layer system for matchability, while at the same time achieving heat treatability and yet have flexibility to vary the solar management properties over a reasonably wide range to avoid further production shut-downs (to meet the needs of different customers), that artisan was faced with an unsolvable problem.

It is apparent from the above that there exists a need in the art for a sputter-coated layer system which achieves the benefits of sputter-coating while overcoming the above-described problems and drawbacks in the art. It is a purpose of this invention to fulfill this need in the art as well as other needs which will become apparent to the skilled artisan once given the following disclosure.

SUMMARY OF THE INVENTION

Generally speaking, this invention fulfills the above-described needs in the art by providing a glass article which includes a glass substrate having thereon a sputter-coated layer system comprising from the glass substrate outward (a) an undercoat layer of silicon nitride ($Si_3N_4$), (b) a substantially metallic layer which includes nickel or a nickel alloy and which is substantially free of any nitride; and (c) an overcoat layer of silicon nitride ($Si_3N_4$); and wherein the layers are each of sufficient thickness such that when the glass substrate has a thickness of about 1.5 mm–13 mm and has the aforesaid layer system thereon, the so-layered glass article when heat treated is matchable with a glass article having the same layer system thereon in that its glass side reflectance $\Delta E$, as measured by the Hunter technique (i.e. $\Delta E_H$, ASTM 2244-93) is no greater than about 2.0. In further preferred embodiments the so-layered glass article is also heat treatable and has a visible transmittance of about 1–80%, and more preferably below about 70%. In certain further preferred embodiments the glass article both before and after heat treatment is durable and chemically resistant. In still further preferred embodiments of this invention the layer system does not contain any layer of silver.

This invention further fulfills the above-described needs in the art by providing a method of heat treating a coated glass article which generally comprises:

a) sputter-coating onto a glass substrate a layer system comprising from the glass substrate outwardly, an undercoat layer of silicon nitride, a substantially metallic layer which includes nickel or a nickel alloy; and an overcoat layer of silicon nitride; and b) thereafter subjecting this coated glass substrate to a heat treatment selected from the group consisting of bending, tempering, heat strengthening and combinations thereof; and c) wherein after this heat treatment the resultant article has a glass side reflectance $\Delta E_H$ (as defined above) of no greater than about 2.0 as compared to the coated glass substrate prior to said heat treatment.

The layer systems as aforesaid are preferably formed by sputter-coating each layer to its requisite thickness onto a glass substrate. While the glass thickness may be varied widely, typically the glass article will be of the float glass type and have a thickness of about 1.5–13.0 mm (i.e. about 0.060"–0.50") and more usually about 2 mm–6 mm. The glass may be tinted or non-tinted, or patterned glass. Such glass may be of the single strength type.

In order to properly define the matchability achieved by this invention, the various characteristics set forth herein are measured by application to a clear glass substrate (thereby to emphasize that matchability is achieved by the coating system and not by the effects of the substrate). Typical characteristics achieved by the unique coating systems of this invention are as follows:

| Characteristic | Range | Preferred Range |
|---|---|---|
| Visible (TY) Transmission: | about 1%–80% | less than about 70% |
| Visible ($R_GY$) Reflectance (glass side): | about 4%–55% | about 5%–45% |
| Visible ($R_fY$) Reflectance (film side): | about 4%–65% | about 5%–45% |
| Visible Color (glass side): | silver, pewter, blue, gray | about $a_h$, 0 ±2 b, −4 ± 4 |
| Emittance (normal, i.e. $E_n$ & hemis., $E_h$) | about 0.10–0.75 | about 0.2–0.75 |
| Sheet Resistance ($R_s$): | about 20–500 ohms/square | about 20–300 ohms/square |
| Solar ($T_s$) Transmission: | about 1%–80% | less than about 70% |
| $\Delta E_H$ glass side refl. | about ≦2.0 | less than about 1.5 |
| $\Delta E_H$ film side refl. | about ≦5.0 | less than about 4.0 |
| $\Delta E_H$ Vis. Transm. | ≦5.0 | ≦4.0 |

In the most preferred forms of this invention the resultant article, and its layer system, both before and after heat treatment exhibits excellent chemical resistance and durability (i.e. abrasion or scratch resistance).

IN THE DRAWINGS

FIG. 1 is a partial, side sectional view of a coating system on a glass substrate which illustrates an embodiment of this invention.

DETAILED DESCRIPTION OF EMBODIMENTS OF THE INVENTION

Certain terms are prevalently used in the glass-coating art, particularly when defining the properties and solar management characteristics of coated glass used in the architectural and/or automotive field. Such terms are used herein in accordance with their well-known meaning. For example, as used herein:

Intensity of visible wavelength light, "reflectance" is defined by its percentage and is reported as $R_xY$ (i.e. the Y value cited below in ASTM 308-85), wherein "X" is either "G" for glass side or "F" for film side. "Glass side" (e.g. "G") means, as viewed from the side of the glass substrate opposite that on which the coating resides, while "film side" (i.e. "F") means, as viewed from the side of the glass substrate on which the coating resides.

Color characteristics are measured using the "a" and "b" coordinates. These coordinates are indicated herein by the subscript "h" to signify the conventional use of the Hunter method (or units) Ill. C, 10 observer, according to ASTM D-2244-93 "Standard Test Method for Calculation of Color Differences From Instrumentally Measured Color Coordinates" Sep. 15, 1993 as augmented by ASTM E-308-85, Annual Book of ASTM Standards, Vol. 06.01 "Standard Method for Computing the Colors of Objects by Using the CIE System".

The terms "emissivity" and "transmittance" are well understood in the art and are used herein according to their well known meaning. Thus, for example, the term "transmittance" herein means solar transmittance, which is made up of visible light transmittance (TY), infrared energy transmittance, and ultraviolet light transmittance. Total solar energy transmittance (TS) is then usually characterized as a weighted average of these other values. With respect to these transmittances, visible transmittance, as reported herein, is characterized by the standard Illuminant C technique at 380–720 nm; infrared is 800–2100 nm; ultraviolet is 300–400 nm; and total solar is 300–2100 nm. For purposes of emissivity, however, a particular infrared range (i.e. 2,500–40,000 nm) is employed, as discussed below.

Visible transmittance can be measured using known, conventional techniques. For example, by using a spectrophotometer, such as a Beckman 5240 (Beckman Sci. Inst. Corp.), a spectral curve of transmission is obtained. Visible transmission is then calculated using the aforesaid ASTM 308/2244-93 methodology. A lesser number of wavelength points may be employed than prescribed, if desired. Another technique for measuring visible transmittance is to employ a spectrometer such as a commercially available Spectragard spectrophotometer manufactured by Pacific Scientific Corporation. This device measures and reports visible transmittance directly. As reported and measured herein, visible transmittance (i.e. the Y value in the CIE tristimulus values, ASTM E-308-85) uses the Ill. C., 10° observer.

"Emissivity" (E) is a measure, or characteristic of both absorption and reflectance of light at given wavelengths. It is usually represented by the formula:

$$E = 1 - \text{Reflectance}_{film}$$

For architectural purposes, emissivity values become quite important in the so-called "mid-range", sometimes also called the "far range" of the infrared spectrum, i.e. about 2,500–40,000 nm., for example, as specified by the WINDOW 4.1 program, LBL-35298 (1994) by Lawrence Berkeley Laboratories, as referenced below. The term "emissivity" as used herein, is thus used to refer to emissivity values measured in this infrared range as specified by the 1991 Proposed ASTM Standard for measuring infrared energy to calculate emittance, as proposed by the Primary Glass Manufacturers' Council and entitled "Test Method for Measuring and Calculating Emittance of Architectural Flat Glass Products Using Radiometric Measurements". This Standard, and its provisions, are incorporated herein by reference. In this Standard, emissivity is reported as hemispherical emissivity ($E_h$) and normal emissivity ($E_n$).

The actual accumulation of data for measurement of such emissivity values is conventional and may be done by using, for example, a Beckman Model 4260 spectrophotometer with "VW" attachment (Beckman Scientific Inst. Corp.). This spectrophotometer measures reflectance versus wavelength, and from this, emissivity is calculated using the aforesaid 1991 Proposed ASTM Standard which has been incorporated herein by reference.

Another term employed herein is "sheet resistance". Sheet resistance ($R_s$) is a well known term in the art and is used herein in accordance with its well known meaning. Generally speaking, this term refers to the resistance in ohms for any square of a layer system on a glass substrate to an electric current passed through the layer system. Sheet resistance is an indication of how well the layer is reflecting infrared energy, and is thus often used along with emissivity as a measure of this characteristic. "Sheet resistance" is conveniently measured by using a 4-point probe ohmmeter, such as a dispensable 4-point resistivity probe with a Magnetron Instruments Corp. head, Model M-800 produced by Signatone Corp. of Santa Clara, Calif.

"Chemical durability" or "chemically durable" is used herein synonymously with the term of art "chemically resistant" or "chemical stability". Chemical durability is determined by boiling a 2"×5" sample of a coated glass substrate in about 500 cc of 5% HCl for one hour (i.e. at about 220° F.). The sample is deemed to pass this test (and thus the layer system is "chemically resistant" or is deemed to have "chemical durability") if the sample's layer system shows no pinholes greater than about 0.003" in diameter after this one hour boil.

"Mechanical durability" or simply "durable" as used herein is defined by one of two tests. The first test uses a Pacific Scientific Abrasion Tester (or equivalent) wherein a 2"×4"×1" nylon brush is cyclically passed over the layer system in 500 cycles employing 150 gm of weight, applied to a 6"×17" sample. In the other, alternative test, a conventional Taber abrader (or equivalent) is used to subject a 4"×4" sample to 300 revolutions of two C.S. 10F abrasion wheels, each having attached a 500 gm weight. In either test, if no substantial, noticeable scratches appear when viewed with the naked eye under visible light, the test is deemed passed, and the article is said to be "durable".

Thicknesses of the various layers in the systems reported are measured by, and thus the term, "thickness" as used herein is defined by alternative techniques. In one technique, known optical curves, or, in the alternative, the use of a conventional needle ellipsometer (i.e. profilometer) is employed. In another and particularly advantageous technique, an "n & k" analyzer is used (n & k Technology, Inc., Santa Clara, Calif.). This technique is believed to be generally described in U.S. Pat. No. 4,905,170, along with the ability to determine the "n" (i.e. refractive index) and "k" (i.e. the coefficient of extinction) values of the film under investigation. The disclosure of this patent is incorporated herein by reference. Such procedures and techniques are well known to the skilled artisan and thus need no further explanation, except to note that thicknesses reported and used herein are reported in angstrom units (Å).

Another term used herein, and one important to an understanding of the subject invention, is the term "delta E" (i.e. "$\Delta E$"). This term is well understood in the art and is reported, along with various techniques for determining it, in the aforesaid ASTM-2244-93 (the disclosure of which is incorporated herein by reference).

As reported and determined according to ASTM-2244-93, "$\Delta E$" is a way of adequately expressing the change (or lack thereof) in reflectance and/or transmittance (and thus color appearance, as well) in an article. Reported therein is $\Delta E$ as determined by the "ab" technique, by the Hunter (H) technique, and/or by the Friele-MacAdam-Chickering (FMC-2) technique. All are deemed useful, and equivalent for the purposes of this invention. However, for convenience, the "$\Delta E$'s" used herein, and recited in the claims of this invention, are those determined by the Hunter technique and are thus conventionally designated as $\Delta E_H$. Thus, for example, when stating that the "glass side reflectance $\Delta E_H$" of a coated substrate as contemplated herein is no greater than about 2.0, the value 2.0 is the Hunter value. Within the scope of this invention, then, of course, are the equivalent (matching) values if determined by one of the other two techniques ("ab" or FMC-2) reported in ASTM-2244-93 or any other technique for calculating such a change or lack thereof.

In this respect, it should be pointed out that for most commercial purposes contemplated, it is the glass side reflectance characteristic that must have the lowest possible ΔE for matchability, and that the ΔE for film side reflectance and/or transmittance are either unimportant or of significantly less importance for most, but not all, applications. Nevertheless, this invention contemplates for matchability when these latter two ΔE's are of consideration that "film side reflectance ΔE", as well as "visible transmittance ΔEH", should be less than or equal to about 5.0, and preferably less than or equal to about 4.0. These, of course, are Hunter values and the same discussion above regarding equivalency of values using other techniques applies here, as well.

Turning now to FIG. 1, there is illustrated a partial cross-sectional view of a typical embodiment of an article according to this invention. Therein glass substrate 1 has provided on it an undercoat 2 (i.e. layer 1) of $Si_3N_4$, an intermediate layer 3 (i.e. layer 2) of as non-nitrided nickel or nickel alloy (preferably 80/20 nichrome) and an overcoat 4 (i.e. layer 3) of $Si_3N_4$. The layers themselves are referred to as layers 1, 2, 3, respectively.

The process and apparatus used to form the various layers on glass substrate 1 may be a conventional multi-chamber (multi-target) sputter-coating system such as is produced by Airco, Inc. An example of a coater useful herein is a G-49 Airco Inc. large area flat glass sputter coater. It is to be noted here that it is an aspect of this invention that its unique results are achieved through the use of conventional sputter-coating techniques without the need for special processes to relieve intrinsic stresses as reported in U.S. Pat. No. 5,377,045 discussed above.

As shown in FIG. 1, only 3 layers, i.e. 1, 2, and 3, are employed in this embodiment. From the glass outwardly the layers and both a general and a preferred range of thicknesses, measured by the "n & k" technique above, for this particular embodiment are:

| Layer | Ingredient | Thickness (Å) | Preferred Thickness (Å) |
|---|---|---|---|
| 1 | $Si_3N_4$* | about 5–70 | about 30–50 |
| 2 | Ni or nichrome** | about 30–150 | about 50–100 |
| 3 | $Si_3N_4$* | about 200–500 | about 300–400 |

*the target may be admixed with up to about 6% by wt. aluminum and/or stainless steel (e.g. ss#316), with about this amount appearing in the layer formed.
**preferably nichrome is employed (e.g. 80/20 Ni/Cr by weight)

It is a feature of this invention that the heretofore believed essential limitation of having to use a high content nickel alloy (or pure nickel) to achieve heat treatability is no longer applicable when used in combination with the layers of $Si_3N_4$ as set forth above. While layer 2 should be a nickel-containing layer, it need not be a high content nickel alloy. It is a requirement, however, for this invention, that while some small or minor amount of oxidation may be tolerated in the nickel-containing layer, the nickel-containing layer must remain substantially free of any nitride so as to be sufficiently chemically resistant to satisfy most needs. However, it has been found preferable for optimized matchability that substantially no oxidation of the nickel or nickel alloy layer be allowed to take place. In this respect, while nitrides do not significantly interfere with the achievement of heat treatability in most instances, the formation of such a nitride has been found to reduce chemical durability as measured by the aforesaid 5% HCl boil test.

As stated above, the nickel-containing layer may be substantially all nickel, but are more preferably a simple Ni/Cr alloy. An example of one such group of alloys which may be used are the rather large number of stainless steels having as their nickel content as little as about 10% by weight nickel (e.g. SS-316, which is 10% Ni and 90% other, mainly Fe and Cr). Of course, high content nickel/chromium alloys remain preferred for use in this invention. Such include 80/20 by weight Ni/Cr and Haynes 214 Alloy whose nominal composition by weight consists essentially of:

| Element | (Approx.) Wt. % |
|---|---|
| Ni | 75.45 |
| Fe | 4.00 |
| Cr | 16.00 |
| C | .04 |
| Al | 4.50 |
| Y | .01 |

Other examples of Ni/Cr alloys useful in the practice of this invention include Inconel and nichrome. Generally speaking, then, the metallic layer(s) used in combination with the sandwiching $Si_3N_4$ layers as contemplated by this invention include at least about 10% by weight nickel, and these layers must be present in substantially unoxidized form (or have undergone only a minor amount of oxidation) and is preferably substantially free of a nitride to maximize chemical resistance.

While a three layer system is shown in the FIGURE, it is understood that the invention is not so limited. Other layers may be added if desired so as to effect further purposes and characteristics. However, such other layers should not adversely affect the matchability characteristic unique to this invention. Thus, as used herein, the term "consisting essentially of" means that the invention is not confined to a three layer system, so long as matchability is still achieved despite the addition of one or more layers to the essential three layers described above.

EXAMPLES

The following layer systems were sputter-coated using the aforesaid G-49 Airco large area, flat glass sputter coater onto clear glass substrates of ¼" in thickness and 100"×144" in width and length, using Si target(s) doped with about 6% by wt. aluminum and conventional sputter-coating techniques as indicated. The chemical and durability tests employed are as described above. The heat treatment employed exemplified a typical tempering process using a commercial tempering furnace which subjected the sample to about 1265° F. (685° C.) for an approximately 3 minute cycle (actual sample temperature about 1200° F.) and quenched to room temperature. The samples were cut before tempering to 24"×36" plates. Coating layer thickness measurements were made according to the "n & k" technique described above.

EXAMPLE 1 (Reference Numerals are to the FIGURE)

Using the aforesaid conventional coater and the below-listed coater settings, a first undercoat 2 [layer 1] was applied to a thickness of about 40 Å onto the aforesaid clear float glass substrate. An intermediate nichrome coating 3 (80/20 Ni:Cr by weight) [i.e. layer 2] was then applied at a thickness of about 75 Å. Finally an overcoat layer [layer 3] of $Si_3N_4$ was applied at a thickness of about 350 Å.

The coated samples so formed passed the mechanical durability and chemical resistance tests above-described both before and after tempering and were heat treatable as defined above. Their solar management properties and Hunter ΔE's (and Hunter color coordinates $a_h$ and $b_h$) are reported below. In short, the coated article was found to be durable, temperable, bendable, and did not change significantly in appearance as a result of the tempering heat treatment to which it was subjected. It was therefore deemed matchable on a commercially acceptable basis and had highly desirable solar management properties useful in single pane or IG multi-pane architectural products.

| | | | | Coater Settings | | | | | |
|---|---|---|---|---|---|---|---|---|---|
| LAYER | MATERIAL | $N_2$ % | Ar % | PRESSURE (Torr) | CATHODE POWER | CATHODE VOLTAGE | CATHODE AMPS | LINE SPEED | No. OF PASSES |
| 1 | Silicon | 80 | 20 | $2.0 \times 10^{-3}$ | 27.7 KW | 414 V | 66.9 A | 334 | 1 |
| 2 | Nichrome | 0 | 100 | $2.0 \times 10^{-3}$ | 18.1 KW | 429 V | 42.1 A | 334 | 1 |
| 3 | Silicon | 80 | 20 | $2.0 \times 10^{-3}$ | 334.9 KW | 462 V | 724.9 A | 334 | 1 |

OPTICAL PROPERTIES
(Ill. C, 10° observer, Hunter Values)

| PROPERTY | Y | ah | bh |
|---|---|---|---|
| Glass Side Reflectance (Not Heated) | 12.93 | −1.1 | −8.1 |
| Glass Side Reflectance (Heated) | 12.75 | −1.12 | −7.75 |
| Delta E | 0.44 | | |
| Film Side Reflectance (Not Heated) | 9.79 | 1.53 | 4.05 |
| Film Side Reflectance (Heated) | 10.67 | 1.15 | 3.34 |
| Delta E | 1.6 | | |
| Transmittance (Not Heated) | 51.85 | −2 | −2.59 |
| Transmittance (Heated) | 52.99 | −1.93 | −2.29 |
| Delta E | 0.84 | | |

Normal ($E_n$) and hemispherical ($E_h$) emissivities were 0.73 and 0.69, respectively, and sheet resistance ($R_s$) was 269 ohms/sq. before heat treatment. After heat treatment $E_n$ and $E_h$ were 0.71 and 0.67, respectively, and $R_s$ was 235 ohms/sq. (i.e. each is deemed an insignificant change under the aforesaid definition of "heat treatable").

EXAMPLE 2

The procedures of EXAMPLE 1 above were repeated, except that intermediate nichrome 3's [i.e. layer 2's] thickness was increased to about 140 Å (i.e. approximately doubled) in order to substantially reduce visible transmittance into a true "privacy" window range (e.g. about 30% visible glass side transmittance). The tables below list the coater settings and properties, respectively. Once again the coated article was found to be matchable on a commercially acceptable basis, durable, temperable, bendable, and exhibited no significant change in appearance as a result of heat treatment. It also exhibited desirable solar management properties, particularly where low visible transmittance for privacy is desired.

Normal ($E_n$) and hemispherical ($E_h$) emissivities were 0.55 and 0.54, respectively, and sheet resistance ($R_s$) was 108 ohms/sq. before heat treatment. After heat treatment $E_n$ and $E_h$ were 0.48 and 0.49, respectively, and $R_s$ was 89 ohms/sq. (each again is deemed an insignificant change and within the definition of "heat treatable" set forth above).

Once given the above disclosure many other features, modifications and improvements will become apparent to the skilled artisan. Such other features, modifications and improvements are therefore considered to be a part of this invention, the scope of which is to be determined by the following claims:

We claim:

1. A method of heat treating a coated glass article comprising:

a) sputter-coating onto a glass substrate having a thickness of about 1.5 mm–13 mm a layer system comprising from the glass substrate outwardly:

an undercoat layer comprised of silicon nitride;

a substantially metallic layer which includes nickel or a nickel alloy having a nickel content of at least 10% by

| | | | | Coater Settings | | | | | |
|---|---|---|---|---|---|---|---|---|---|
| LAYER | MATERIAL | $N_2$ % | Ar % | PRESSURE (Torr) | CATHODE POWER | CATHODE VOLTAGE | CATHODE AMPS | LINE SPEED | No. OF PASSES |
| 1 | Silicon | 80 | 20 | $2.0 \times 10^{-3}$ | 28.2 KW | 414 V | 68.1 A | 334 | 1 |
| 2 | Nichrome | 0 | 100 | $2.0 \times 10^{-3}$ | 39.3 KW | 454 V | 86.6 A | 334 | 1 |
| 3 | Silicon | 80 | 20 | $2.0 \times 10^{-3}$ | 334.9 KW | 462 V | 724.9 A | 334 | 1 |

OPTICAL PROPERTIES
(Ill. C, 10° observer, Hunter Values)

| PROPERTY | Y | ah | bh |
|---|---|---|---|
| Glass Side Reflectance (Not Heated) | 20.6 | 0.9 | −3.59 |
| Glass Side Reflectance (Heated) | 19.5 | −1.22 | −5.03 |
| Delta E | 1.9 | | |
| Film Side Reflectance (Not Heated) | 15.6 | 2.45 | 14.31 |
| Film Side Reflectance (Heated) | 16.4 | 1.47 | 10.43 |
| Delta E | 3.9 | | |
| Transmittance (Not Heated) | 32.1 | −1.8 | −5.93 |
| Transmittance (Heated) | 33.4 | −1.55 | −3.82 |
| Delta E | 2.5 | | | weight Ni, and which is substantially free of any nitride, or oxide; and an overcoat layer comprised of silicon nitride, and b) thereafter subjecting said coated glass substrate to a heat treatment selected from the group consisting of bending, tempering, heat strengthening and combinations thereof;

wherein after said heat treatment the resultant article exhibits a glass side reflectance $\Delta_H$ of no greater than about 2.0.

2. A method of heat treating a coated glass article according to claim 1 wherein said heat treatment consists essentially of tempering said glass by subjecting said glass article to an environmental temperature greater than about 1200° F. and quenching said glass article for a period of time to temper said glass article.

3. A method of heat treating a coated glass article according to claim 1 wherein said undercoat layer has a thickness of about 5–70 Å said substantially metallic layer has a thickness of about 30–150 Å, and said overcoat layer has a thickness of about 200–500 Å, and wherein after said heat treatment said glass article exhibits a film side reflectance $\Delta E_H$ of no greater than about 5.0, and has the following characteristics both before and after heat treatment:

TY, about 1%–80%

$R_G Y$, about 4%–55%

$R_f Y$, about 4%–65%

$E_n$, about 0.1–0.75

$E_H$, about 0.1–0.75

$R_s$, about 20–500 ohms/sq.

4. A method of heat treating a coated glass article according to claim 3 wherein said sputter coating includes applying layer (a) at a thickness of about 30–50 Å, applying layer (b) at a thickness of about 50–100 Å, and applying layer (c) at a thickness of about 300–400 Å, and wherein the glass article has the following characteristics both before and after heat treatment:

TY, less than about 70%

$R_G Y$, about 5%–45%

$R_f Y$, about 5%–45%

Visible color, $a_h$ about 0±2 $b_h$ about –4±4

$E_n$, about 0.2–0.75

$E_h$, about 0.2–0.75

$R_s$, about 20–300 ohms/sq. and wherein said glass article both before and after heat treatment is durable and chemically resistant.

5. A method according to claim 4 wherein said layer (b) is applied at a thickness of about 75 Å and the glass article both before and after heat treatment has a TY of about 50%, a visible transmittance $\Delta E_H$ of less than about 1.0, and a glass side reflectance $\Delta E_H$ of less than about 0.5.

6. A method according to claim 4 wherein said layer (b) is applied at a thickness of about 140 Å and the glass article both before and after heat treatment has a TY of about 30% and a visible transmittance $\Delta E_H$ of less than about 3.0.

7. A method of producing a heat treated sputter-coated glass article which is aesthetically matchable with a non-heat treated, sputter-coated glass article so as to have at least substantially the same glass side appearance, the steps including:

a) sputter-coating onto each of at least two glass substrates each having a thickness of about 1.5 mm–13 mm a layer system comprising from the glass substrates outwardly:

an undercoat layer comprised of silicon nitride;

a substantially metallic layer which includes nickel or a nickel alloy having a nickel content of at least 10% by weight Ni, and which is substantially free of any nitride or oxide; and an overcoat layer comprised of silicon nitride, b) subjecting at least one of said sputter-coated substrates to a heat treatment selected from the group consisting of bending, tempering, heat strengthening and combinations thereof; whereby said at least one substrate after heat treatment exhibits a glass side reflectance $\Delta E_H$ of no greater than about 2.0 when compared to said non-heat treated substrates, said heat treated sputter-coated substrates so formed being of substantially the same glass side appearance as said non-heat treated sputter-coated substrates.

8. A method according to claim 7 wherein said glass substrates both before and after said heat treatment have the following characteristics:

TY, less than about 70%

$R_G Y$, about 5%–45%

$R_f Y$, about 5%–45%

Visible color, $a_h$ about 0±2 $b_h$ about –4±4

$E_n$, about 0.2–0.75

$E_h$, about 0.2–0.75

$R_s$, about 20–300 ohms/sq.

and wherein said heat treated substrates after heat treatment exhibit the following characteristics as compared to said non-heat treated substrates:

a film side reflectance $\Delta E_H$ no greater than about 5.0, a visible transmittance $\Delta E_H$ no greater than about 5.0.

9. A method according to claim 7 wherein said glass substrates both before and after said heat treatment have the following characteristics:

TY, about 50%

$R_G Y$, about 13%

$R_f Y$, about 10–11% a glass side reflectance $\Delta E_H$ of less than about 1.5, a film side reflectance $\Delta E_H$ of less than about 4.0, a visible transmittance $\Delta E_H$ of less than about 4.0;

and wherein said coated glass substrates are durable and chemically resistant.

10. A method according to claim 7 wherein said glass substrates both before and after said heat treatment have the following characteristics:

TY, about 30%

$R_G Y$, about 20–21%

$R_f Y$, about 16%, a glass side reflectance $\Delta E_H$ of less than about 2.0, a film side reflectance $\Delta E_H$ of less than about 4.0, a visible transmittance $\Delta E_H$ of less than about 3.0, and wherein said coated glass substrates are durable and chemically resistant.

* * * * *

UNITED STATES PATENT AND TRADEMARK OFFICE
CERTIFICATE OF CORRECTION

PATENT NO.    : 5,837,108
DATED         : November 17, 1998
INVENTOR(S)   : Philip J. Lingle, Klaus W. Hartig and Steven L. Larson It is certified that error appears in the above-identified patent and that said Letters Patent is hereby corrected as shown below:

Column 1,
Line 66, delete "n" after -- higher, --.

Column 6,
Line 64, insert -- ° -- (degree symbol) after -- 10 --.

Column 7,
Line 30, delete "." (period) after -- C --.

Column 9,
Line 6, delete "ΔEH" after "transmittance" and substitute -- $\Delta E_H$ --.

Column 13,
Line 9, delete "$\Delta_H$" after "reflectance" and substitute -- $\Delta E_H$ --;
Line 20, insert -- , -- (coma) after -- Å --.

Signed and Sealed this

Sixteenth Day of October, 2001

Attest:

NICHOLAS P. GODICI

*Attesting Officer*        *Acting Director of the United States Patent and Trademark Office*